United States Patent [19]

Geiger

[11] Patent Number: 5,701,302

[45] Date of Patent: Dec. 23, 1997

[54] METHOD AND APPARATUS FOR ADAPTIVELY COMPANDING DATA PACKETS IN A DATA COMMUNICATION SYSTEM

[75] Inventor: Robert L. Geiger, Algonquin, Ill.

[73] Assignee: Motorola, Inc., Schaumburg, Ill.

[21] Appl. No.: 547,747

[22] Filed: Oct. 25, 1995

[51] Int. Cl.[6] ................................................. G05B 19/04
[52] U.S. Cl. ........................... 370/521; 341/106; 375/240
[58] Field of Search .................................. 370/465, 477, 370/521; 375/240, 241; 455/72; 341/51, 55, 106

[56] References Cited

U.S. PATENT DOCUMENTS

| | | | |
|---|---|---|---|
| 5,130,993 | 7/1992 | Gutman et al. | 371/42 |
| 5,245,614 | 9/1993 | Gutman et al. | 370/118 |
| 5,521,940 | 5/1996 | Lane et al. | 375/240 |
| 5,530,645 | 6/1996 | Chu | 341/106 |
| 5,579,316 | 11/1996 | Venters et al. | 370/477 |

*Primary Examiner*—Melvin Marcelo
*Attorney, Agent, or Firm*—Daniel C. Crilly

[57] ABSTRACT

A data communication system (100) employs a method and apparatus for adaptively companding (compressing and expanding) data packets therein. A first communication device (e.g., 107) generates a plurality of data packets (201–207) and selects one or more, but not all, of the data packets. The first device then performs a compression of each data packet in a first group of data packets that includes the selected data packets (202–205). The first device transmits the compressed data packets to a second communication device (e.g., 108). Upon receiving the compressed data packets, the second device determines whether the received compressed data packets include one or more of the data packets selected by the first device. When the received data packets include one or more of the selected data packets, the second device transmits a response packet (301) to the first device indicating which, if any, of the selected data packets were received. Upon receipt of the response packet, the first device performs an adaptive compression of each data packet in a second group of data packets based on the response packet and transmits the adaptively compressed data packets to the second device. The second device expands the adaptively compressed data packets based on which selected data packets were received in the previous transmission.

30 Claims, 5 Drawing Sheets

| CHARACTER STRING | EXPANDED REPRESENTATION | COMPRESSED REPRESENTATION |
|---|---|---|
| A | 1111 | 00 |
| AN | 11111011 | 01 |
| THE | 110110010011 | 10 |
| AND | 111110110111 | 11 |
| THEM | 1101100100110001 | 001 |
| ARE | 111110000011 | 010 |

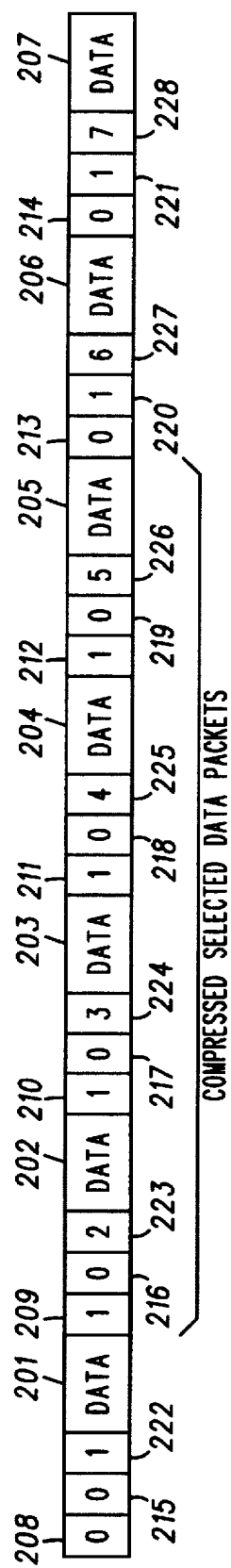
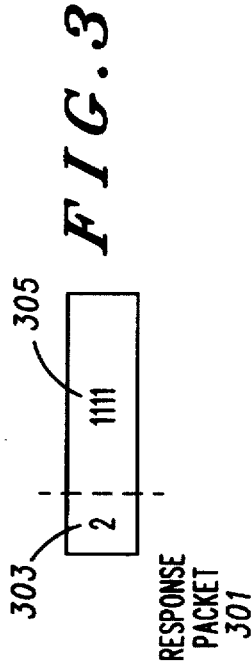
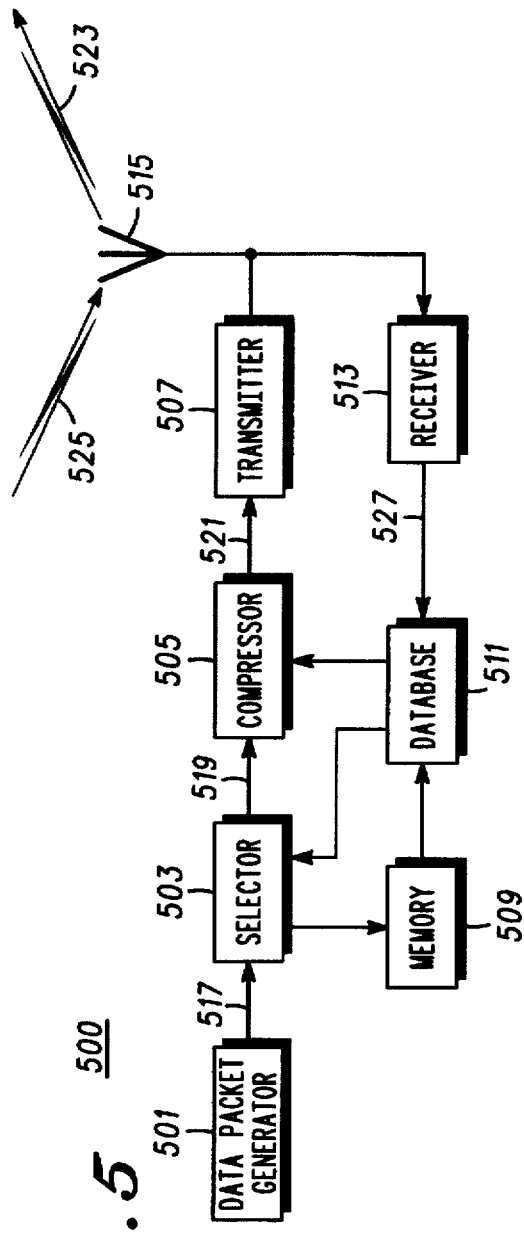

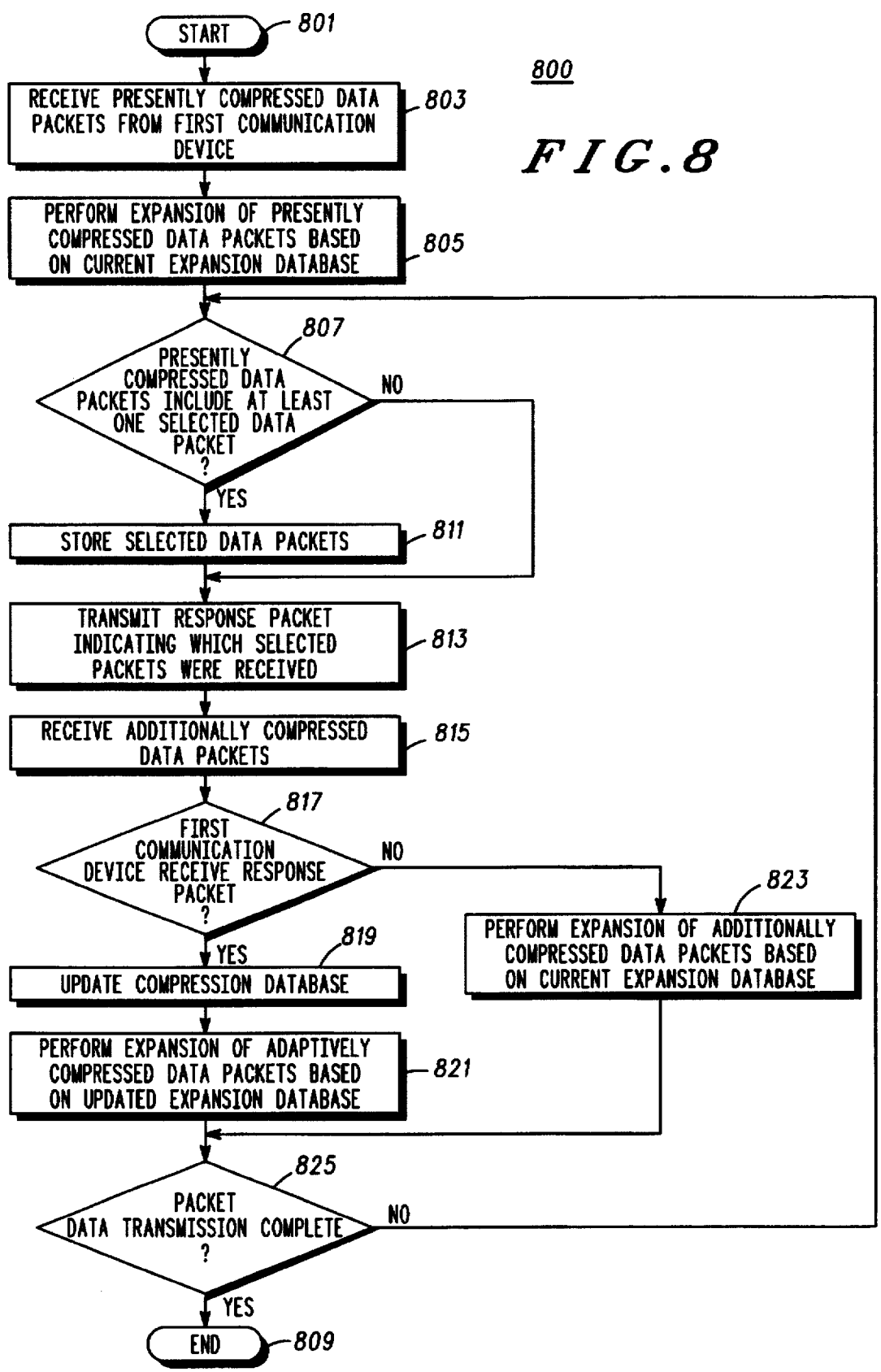

METHOD AND APPARATUS FOR ADAPTIVELY COMPANDING DATA PACKETS IN A DATA COMMUNICATION SYSTEM

FIELD OF THE INVENTION

The present invention relates generally to data communication systems and, in particular, to a method and apparatus for adaptively compressing and expanding data packets in a data communication system.

BACKGROUND OF THE INVENTION

Packet data communication systems are known in both the wireless and wireline environments. In the wireless environment, the packet data system includes packet data routers, base site controllers, base sites, and wireless communication devices (e.g., mobile radios, portable radios, radiotelephones, or wireless data terminals). In the wireline environment, the packet data system includes switches and wireline communication devices (e.g., personal computers, computer servers, mainframes, laptop computers, personal communication devices, or custom data terminals). Packet data communications are also known to exist between wireless and wireline systems.

Data is transmitted over wireline systems using one of two primary formats: connectioned and connectionless. In a connectioned wireline system, a data communication is established during a connection set-up phase in which the participating wireline communication devices interchange set-up messages. Once the communication has been established, data transmission typically occurs between the two participating wireline communication devices when a transmitting device apportions its data into data packets and sends the data packets sequentially to the switch supporting the transmitting device. The switch then forwards the data to other switches (as necessary), while maintaining packet sequence, until the data eventually reaches the target communication device. The time delay associated with the transmission is related to the size (in bits) and the quantity of data packets.

In order to reduce the transmission delay, connectioned wireline systems typically use compression techniques to reduce the quantity of data necessary to complete a data transmission. Compression is performed by the transmitting device to reduce the number of bits necessary to represent a portion of the data. In a typical form known as dictionary compression, the transmitting device compares portions of the data stream to entries in a database and, when a match occurs, replaces the matching stream with a code word containing less bits than the matching stream. In this manner, the data stream is compressed using the code words in the database. Upon receipt of the compressed data, the target device expands the compressed data in a similar, but opposite, manner using an identical database to recover the original, uncompressed data.

Dictionary compression exists in two forms: static and dynamic. With static compression, both the sending device and the receiving device are prestored with identical compression/expansion databases to be used for all communications. This approach works well when the characteristics of the data (e.g., data type) remain constant for each communication and when relatively small quantities of data are transferred during each communication. By contrast, with dynamic compression, the sending and receiving devices update their databases based on the content of the data being transferred. Thus, dynamic compression facilitates every type of packet data communication because dynamic compression does not rely on a priori knowledge of the data.

To accomplish dynamic, or adaptive, compression, the sending device updates its compression database with information contained in each data packet of the communication, unless the existing entries in the database are sufficient to compress all the data in a particular packet. Similarly, the receiving device updates its expansion database with information contained in each data packet of the communication, unless the existing entries in the database are sufficient to expand all the data in a particular packet. Since each data packet is being used to update the compression/expansion databases, the sending device must be sure that the receiving device has received each data packet in sequence in order for the receiving device to properly update its database.

To insure that the receiving device receives each data packet, the sending and receiving devices typically employ a reliable link protocol, such as a high-level data link control (HDLC) protocol with Link Access Procedure M (LAPM) to perform error correction and recovery. As is known, reliable link protocols transmit data packets in groups, stopping and waiting between each group transmission until acknowledgment of receipt of the group by the receiving device. If the receiving device does not receive a group of packets, the sending device retransmits the lost group, thereby insuring that the receiving device receives each group and, therefore, can update its expansion database to coincide with the sending device's compression database. Since many wireline systems employ high speed data links, retransmission of lost data packets does not substantially impact overall transmission delay of the communication.

Similar to connectioned wireline systems, connectionless wireline systems, such as the Internet, utilize high reliability links; however, in contrast to connectioned systems, connectionless systems do not guarantee packet sequence during transmission. Thus, existing compression/expansion techniques are not readily adaptable to connectionless systems since the existing techniques require receipt of the transmitted packets at the receiving device in the same order as they were transmitted.

In contrast to wireline systems, wireless data systems—in particular narrowband wireless data systems—are lower reliability systems than wireline systems due to the higher probability of errors when communicating over a radio frequency (RF) channel than when communicating over a wireline transmission path. Thus, in wireless systems, there is a much greater chance that data packets will be lost or will arrive out-of-sequence at the receiving device. Therefore, the existing compression/expansion techniques used in connectioned wireline networks are not suitable for packet data transmissions in many wireless environments. In those wireless systems that may support existing compression/expansion techniques, the additional delays associated with the stop-and-wait high reliability approach result in timing-out of upper level protocol layers, such as the transmission control protocol (TCP), in the sending and receiving communication devices.

Therefore, a need exists for a method and apparatus for adaptively compressing and expanding data packets in a data communication system that facilitates use in wireless and connectionless wireline systems. Such a method and apparatus that also allowed continuous transmission of data packets, as opposed to a stop-and-wait approach, would be an improvement over the prior art.

BRIEF DESCRIPTION OF THE DRAWINGS

FIG. 2 illustrates a group of compressed selected and unselected data packets in accordance with the present invention.

FIG. 3 illustrates a response packet in accordance with the present invention.

FIG. 5 illustrates a block diagram depiction of a communication device that transmits adaptively compressed data packets in accordance with a preferred embodiment of the present invention.

FIG. 8 illustrates a logic flow diagram of steps executed by a communication device to receive adaptively compressed data packets in accordance with a preferred embodiment of the present invention.

DESCRIPTION OF A PREFERRED EMBODIMENT

Generally, the present invention encompasses a method and apparatus for adaptively companding (compressing and expanding) data packets in a data communication system. A first communication device generates a plurality of data packets and selects one or more, but not all, of the data packets. The first communication device then performs a compression of each data packet in a first group of data packets that includes the selected data packets. The first communication device transmits the compressed data packets to a second communication device. Upon receiving the compressed data packets, the second communication device determines whether the received compressed data packets include one or more of the data packets selected by the first communication device. When the received compressed data packets include one or more of the selected data packets, the second communication device transmits a response packet to the first communication device indicating which, if any, of the selected data packets were received.

Upon receipt of the response packet, the first communication device performs a compression of each data packet in a second group of data packets based on the response packet to produce adaptively compressed data packets and transmits the adaptively compressed data packets to the second communication device. Upon receipt of the adaptively compressed data packets and confirmation that the first communication device received the response packet, the second communication device expands the adaptively compressed data packets based on which selected data packets were received in the previous transmission. By adaptively compressing and expanding data packets in this manner, the present invention permits adaptive compression to be utilized over unreliable transmission links without requiring retransmission of packets that were lost due to the unreliability of the transmission link or that were received out of sequence (e.g., as in connectionless wireline networks) as is required to utilize prior art adaptive compression techniques.

Figures 1, 4:
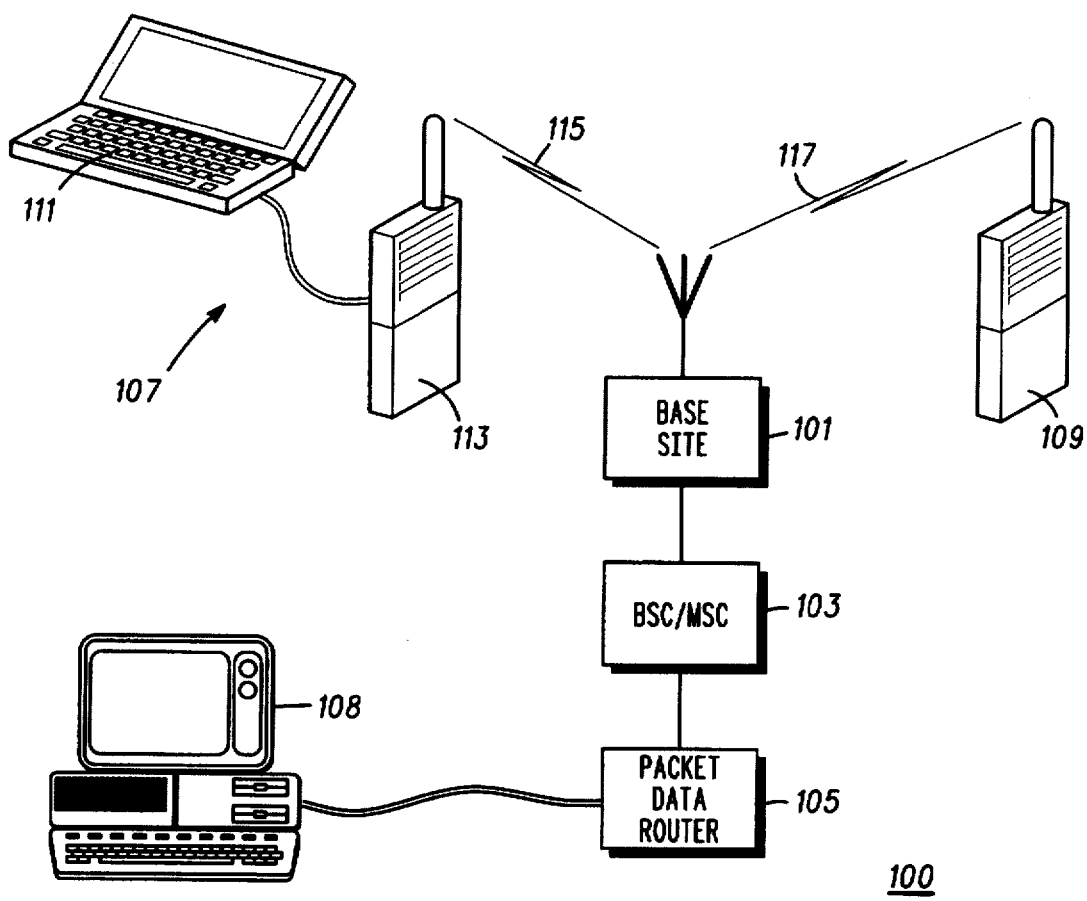
FIG. 1 illustrates a radio communication system that may beneficially employ the present invention.
FIG. 4 illustrates an exemplary adaptive compression/expansion database in accordance with the present invention.

The present invention can be more fully described with reference to FIGS. 1-8. FIG. 1 illustrates a radio communication 100 system that may beneficially employ the present invention. The radio communication system 100 preferably comprises a data communication system, although a combined voice and data communication system may also be used. The radio communication system 100 includes one or more base sites (one base site 101 shown), a base site controller (BSC), a mobile switching center (MSC), a packet data router 105, and a plurality of communication devices 107-109. The BSC and the MSC are depicted together as BSC/MSC block 103 because their independent functions are not critical to understanding the present invention. However, it is well understood that the BSC and the MSC might, and often do, comprise interconnected, yet separate, entities. The base site 101, the BSC/MSC 103, and the packet data router 105 are all well-known; thus, no further discussion will be presented except to facilitate an understanding of the present invention.

The communication devices 107-109 comprise wireless and/or wireline devices. As shown, communication device 107 comprises a portable data terminal 111 (e.g., a notebook computer) coupled to a wireless communication unit 113, such as a mobile or portable radio, a radiotelephone, or a two-way paging device. In an alternate embodiment, communication device 107 might only comprise the portable data terminal 111, wherein the portable data terminal 111 includes the means necessary to provide radio frequency (RF) transmission without necessitating an external wireless communication unit 113. Similar to wireless communication unit 113, communication device 109 is wireless and preferably comprises a mobile or portable radio, a radiotelephone, a two-way paging device, or a wireless data terminal. By contrast, communication device 108 is a wireline device, such as a computer terminal, a laptop computer, a custom data terminal (e.g., a vertical market device), or any other personal communicator that can transmit and receive packet data.

Referring to FIGS. 1-4, operation of the radio communication system 100 occurs substantially as follows in accordance with the present invention. When a communication device (e.g., 107) desires to transfer data to another communication device (e.g., 108 or 109), the communication device 107 requests a radio frequency (RF) communication channel 115 by transmitting a channel request to the BSC/MSC 103 via the base site 101. The channel request includes the identification of the target communication device (108 or 109). If a channel is available at the base site 101, the BSC/MSC 103 assigns the RF channel 115 to the requesting communication device 107. The RF channel 115 assigned depends on the communication platform used in the communication system 100. For example, in a frequency division multiplexed (FDM) system, the RF channel 115 comprises two radio frequencies, one for transmitting and one for receiving. Similarly, in a time division multiplexed (TDM) system, the RF channel 115 comprises two or more time slots, one or more time slots assigned on a transmit frequency and one or more time slots assigned on a receive frequency. Further, in a code division multiple access (CDMA) system, the RF channel 115 comprises a transmit code and a receive code used to transceive information over a common, wideband channel.

Upon receiving a channel grant from the BSC/MSC 103, the requesting communication device 107 generates a plurality of data packets within which to convey its data. For example, the requesting communication device 107 might generate 20 294-millisecond long data packets to transfer a data file of 20 kilobytes (assuming a link speed of 28 kilobits per second over the RF channel 115). Each data packet preferably includes a packet header that contains a selection flag, an error correction flag, and a sequence number. During the generation of the data packets, each data packet is assigned a respective sequence number.

Upon generating the data packets, the communication device 107 begins the transmission process. The communication device 107 first selects a predetermined number of the data packets (e.g., four), preferably in sequence, and identifies them as being selected by setting their selection flags (e.g., to logical 1). In addition, the communication device 107 assigns the error correction flag in each selected data packet and in each unselected data packet immediately preceding the selected data packets (i.e., those unselected packets having sequence numbers lower than the sequence numbers of the selected packets) to a first value (e.g., a logical 1 or a logical 0) to indicate a subgroup of the first group of packets. Similarly, the communication device 107 assigns the error correction flag in each unselected data packet of the first group following the selected data packets (i.e., those unselected packets having sequence numbers larger than the sequence numbers of the selected packets) to a second value (e.g., a logical 1 when the error correction flag of the selected data packets is a logical 0 or a logical 0 when the error correction flag of the selected data packets is a logical 1) to indicate the end of the subgroup containing selected data packets. This subgrouping allows the receiving communication device (e.g., 108) to determine whether all selected packets of a group have been lost during transmission, as is later described. The communication device 107 then stores the selected packets in a memory buffer for later use.

After the selection process, the communication device 107 compresses the first group of data packets. The first group includes selected data packets and unselected data packets. The compression is performed by comparing bit strings in each data packet to current entries in an adaptive compression database, such as the exemplary database 400 shown in FIG. 4. Assuming that the exemplary database 400 currently includes four data entries 402–405, the communication device 107 compares bit strings in the data packets (selected and unselected) of the first group to the expanded representations of the current data entries 402–405 and, when a match occurs, replaces the particular bit string with a corresponding code, or compressed representation. Each expanded representation provides a full binary representation of a character or character string; whereas, each compressed representation provides a more succinct representation of the character or character string. That is, each compressed representation contains less bits than the fully expanded representation. Thus, by compressing data prior to transmission, more data (i.e., more characters or character strings) can be throughput for a given transmission rate (e.g., kilobits per second). For example, if the character string "and the" is to be transmitted, the character string would require 24 bits if each character of the string is represented by four bits and the string is transmitted in its expanded form. However, by compressing commonly used character strings in the exemplary manner shown in FIG. 4, the character string "and the" can be transmitted using only four bits (i.e., using "11" for "and" and "10" for "the"), thereby freeing the previously used 20 bits for other compressed or expanded character string representations.

An exemplary first group of compressed selected data packets 202–205 and compressed unselected data packets 201, 206–207 resulting from the aforementioned selection and compression processes is shown in FIG. 2. Each data packet 201–207 includes a selection flag 208–214, an error correction flag 215–221, a sequence number 222–228, and compressed binary data. The compressed selected data packets comprise four contiguous data packets 202–205 having sequence numbers 223–226 two through five. The compressed selected data packets 202–205 are designated as being selected by having their selection flags 209–212 set to a logical 1. In an alternate embodiment, the compressed selected data packets 202–205 could be designated as being selected by having their selection flags 209–212 set to some other value (e.g., a logical 0).

The subgroup arranged to allow the receiving communication device 108 to identify when a complete set of compressed selected data packets has been lost consists of the compressed selected data packets 202–205 and the compressed unselected data packet 201 preceding the compressed selected data packets 202–205 and having sequence number 222 one. The subgroup is designated by having their error correction flags 215–219 set to logical zero, although any other value would suffice for identification purposes. The compressed unselected data packets 206–207 following the selected data packets 202–205 are not part of the aforementioned subgroup (as denoted by their error correction flags 220–221 having a different value than the error correction flags 215–219 of those packets 201–205 in the subgroup), but they effectively become part of the next subgroup, if such a next subgroup exists. That is, if another set of data packets is selected in the next group of data packets, the next set of selected data packets will have error correction flag values identical to the preceding compressed unselected data packets 206–207 of the previous group. For example, if the next group of compressed selected and unselected data packets were identical to the group shown in FIG. 2, the selected packets in the next group would have their error correction flags set to logical 1, as do the preceding unselected data packets 206–207. The discussion of subsequent compression and selection of data packets is provided below.

After compression of the first group of data packets 201–207, the transmitting device 107 formats the packets for transmission over the RF channel 115 and transmits the compressed packets 201–207 to the receiving communication device 108. The transmitting device 107 transmits the packets 201–207 to the base site 101, which processes the packets 201–207 in accordance with known techniques, and forwards the packets 201–207 to the BSC/MSC 103. The BSC/MSC 103 forwards the packets 201–207 to the packet data router 105 connecting the receiving device 108 to the RF portion of the system 100. The packet data router 105 then forwards the packets 201–207 to the receiving device 108.

Upon receiving the compressed data packets 201–207, the receiving device 108 determines whether any of the received packets 201–207 had been selected by the transmitting device 107. This determination comprises reading the selection flag 208–214 of each received packet 201–207 to determine whether it is set (i.e., has a value of logical 1). If a selection flag is set, then the respective received packet 201–207 was selected by the transmitting device 107. The determination also includes examining the error correction flag of each received packet 201–207 to determine an end of the set of selected packets. For example, if the receiving device 108 received all the transmitted packets 201–207 in the first group in the order shown in FIG. 2 (i.e., in sequential order), the receiving device would determine that packets 202–205 were selected because their selection flags 209–212 are set and that any selected packets must have preceded packet 206 because the error correction flag 220 of packet 206 is different than the error correction flags 215–219 of the preceding packets 201–205.

When the receiving device 108 determines that it has received selected packets, the receiving device 108 generates a response packet indicating which selected packets were received and transmits the response packet to the transmitting communication device 107. An exemplary response packet 301 is depicted in FIG. 3. The response packet 301 preferably includes a starting sequence number 303 and a bitmap 305. The starting sequence number 303 indicates the sequence number (e.g., 223) of the selected received packet (e.g., 202) having the lowest sequence number of the selected received packets 202–205. The bitmap 305 then indicates, in sequence, which of the selected packets were received. For example, if the selected and unselected packets 201–207 of FIG. 2 were received in order, the receiving device 108 would generate a response packet 301 upon receiving unselected packet 206 (i.e., after noticing a change in the value of the error correction flag) that contained a starting sequence number 303 of "2" and a bitmap 305 of "1111". Thus, the response packet 301 would indicate that the receiving device 107 received four selected packets in sequence starting with the selected data packet having sequence number two.

In a preferred embodiment, the present invention also allows sampled data packets to be received out of order (e.g., due to reordering by the packet data router 105) until the error correction flag value of a received unselected packet is different than the error correction flag value of a received selected packet. Thus, if one or more of the received selected packets 202–205 were received out of sequence before receipt of unselected packet 206, the receiving device 108 would include an indication of receipt of the out-of-sequence packets in the response packet 301. For example, if the receiving device 108 received the transmitted packets 201–207 in the following order: 201, 203, 202, 205, 204, 206, 207; the receiving device would generate a response packet 301 as shown in FIG. 3 and described above. However, if the receiving device 108 received the transmitted packets 201–207 in the following order: 201, 203, 202, 204, 206, 205, 207; the receiving device would generate a response packet 301 having a starting sequence number 303 of "2" and a bitmap 305 of "1110" to indicate that only packets 202–204 were received before a change in error correction flag value and, correspondingly, the generation of the response packet 301.

In an alternate embodiment, selected packets received out of sequence might not be referred to in the response packet 301 (i.e., would be denoted "0" in the response packet 301 if the out-of-sequence packet was in the current group of selected packets or would not be referred to at all if the out-of-sequence packet was not in the current group of selected packets). In this case, the receiving device 108 ignores any received selected data packets having sequence numbers less than an expected sequence number, even if the received selected data packet includes the expected error correction flag value. For this embodiment, the expected sequence number is the sequence number of the next data packet. For example, if the sequence number of the last received data packet was "5", the expected sequence number of the next received data packet would be "6." Thus, any selected data packets subsequently received having sequence numbers less than "6" would be ignored for purposes of generating the response packet 301 and updating the expansion database, as later described.

In yet another embodiment, selected packets having sequence numbers less than an alternate expected sequence number might be ignored by the receiving device 108. In this case, the expected sequence number is the next sequence number higher than the sequence number of a last unselected data packet received prior to receiving the selected data packets. For example, if an unselected data packet having sequence number "4" was the most recent data packet received, any received selected data packets having sequence numbers less than "4" will be ignored; whereas, received selected data packets having sequence numbers greater than "4", will be referenced in the response packet. It is desirable for the receiving device 108 to ignore received selected data packets having sequence numbers less than the most recently received unselected data packet because the receiving device 108 has already sent the response packet pertaining to the "old" selected data packets to the transmitting device 107, and the transmitting device 107 has already updated its compression database based on the "old" selected data packets. Updating of the compression database is described in detail below.

In the event that some or all of the selected packets 202–205 are lost during transmission (e.g., due to fading, shadowing, or excessive burst noise), the response packet 301 indicates which selected packets, if any, were received. For example, if the receiving device 108 did not receive any of the selected packets 202–205 before receiving an unselected data packet (e.g., 206) having an unexpected error correction flag value (i.e., an error correction flag value different than that expected for the selected data packets), the receiving device 108 preferably generates a response packet 301 that indicates no selected data packets were received. In this case, the response packet 301 includes a starting sequence number 303 of "0" and a null bitmap 305 (e.g., "0000"). If, on the other hand, the receiving device 107 received only selected data packet 203 before receiving unselected data packet 206, the receiving device 107 would generate a response packet 301 preferably having a starting sequence number 303 of "3" (corresponding to the sequence number 224 of selected data packet 203) and a bitmap 305 of "100". Since the receiving device 107 does not know the sequence numbers of all the selected data packets, but does know the sequence number 224 of the received selected data packet 203 and the sequence number 227 of the unselected data packet having an error correction flag value different from the error correction flag value of the received selected packet 203, the receiving device 107 can only generate a bitmap 305 that reflects the received condition (i.e., selected packet 203 was received, packets 204–205 were not received, and unselected packet 206 was received).

Upon generating the response packet 301, the receiving device 107 transmits the response packet 301 to the transmitting device 107 in a similar, but opposite, manner to which it received the first group of data packets 201–207. Thus, the receiving device 107 provides the response packet 301 to the packet data router 105 and the packet data router 105 provides the response packet 301, via the BSC/MSC 103, to the base site 101 serving the transmitting device 107. The base site 101 then transmits the response packet 301 to the transmitting device 107 via the RF channel 115.

At approximately the same time that the receiving device 107 generates the response packet 301, the receiving device 107 expands, or decompresses, the received compressed data packets (e.g., 201–207). The expansion is performed in manner very similar to the compression by the transmitting device 107. The receiving device 108 preferably compares received data strings with the data entries in an adaptive expansion database, such as that shown in FIG. 4. In a preferred embodiment, the adaptive compression database in the transmitting device 107 is identical to the adaptive expansion database in the receiving device 108. When a match occurs between a received data string and a compressed representation of a character or character string in the database, the receiving device 107 replaces the compressed representation with the corresponding expanded representation to decompress, or expand, each of the received compressed data packets 201-207. The receiving device 108 then stores the expanded selected data packets (i.e., the expanded representations of compressed data packets 202-205) in a memory buffer to be used as described below to adapt, or update, the adaptive expansion database.

It should be noted that during the receiving device's generation of the response packet 301 and expansion of the first group of data packets, the transmitting device 107 continues to transmit compressed data packets using the current adaptive compression database (e.g., data entries 402-405 in the compression database 400 of FIG. 4) to perform the compressions. Thus, in contrast to existing stop-and-wait packet transmission techniques, the present invention permits continuous transmission during adaptation of the transmitting and receiving devices' adaptive compression and expansion databases.

Upon receiving the response packet 301, the transmitting device 107 determines whether the receiving device received any of the compressed selected data packets 202-205 by examining the bitmap 305 in the response packet 301. When the response packet 301 indicates that the receiving device 108 received one or more selected data packets, the transmitting device 107 removes each selected data packet that was received by the receiving device 108 from its memory buffer and creates an additional data entry (e.g., 407 and 408 in FIG. 4) in its adaptive compression database 400 corresponding to each selected data packet received by the receiving device 108. For example, if the response packet 301 indicated that two selected data packets were received by the receiving device 108, the transmitting device 107 would remove the corresponding selected packets from its memory buffer and create two additional data entries (e.g., 407, 408) in its compression database 400 corresponding to the selected packets. Upon updating the compression database 400, the transmitting device 107 selects another set of data packets, in the manner described above, from a supplemental group of generated data packets and stores the newly selected data packets in its memory buffer. The transmitting device 107 then uses the updated database 400 to compress the supplemental group of data packets (selected and unselected) prior to transmission in a manner similar to the compression described above.

Upon compressing the supplemental group of data packets, the transmitting device 107 transmits the compressed supplemental group to the receiving device 108 via the base site 101, the BSC/MSC 103, and the packet data router 105. Upon receiving the supplemental group, the receiving device 108 determines whether any of the received packets were selected by the transmitting device 107. In this case, when the receiving device 108 detects selected data packets, the receiving device 108 not only generates a corresponding response packet, it also creates additional data entries in its adaptive expansion database using the expanded representations of the previously received selected data packets stored in its memory buffer. Likewise, if no selected data packets are detected in the received supplemental group, but two unselected data packets are received having differing error correction flag values (thereby indicating that data packets were selected, but not received), the receiving device 108 creates the additional data entries in its adaptive expansion database using the buffered expanded representations. However, if no selected data packets are detected in the received supplemental group and each of the received supplemental unselected data packets has an identical error correction flag value (thereby indicating that data packets were not selected), the receiving device 108 does not create the additional data entries. Thus, the receiving device 108 uses the selection flag and error correction flags as indicators of whether or not the transmitting device 107 received the previous response packet. Upon updating its adaptive expansion database, the receiving device 108 uses the updated database to expand the received supplemental group of compressed data packets.

The above-described adaptive compression and expansion process preferably continues for the length of a particular packet data communication. Upon starting a new communication, the new transmitting device (e.g., 109) and the new receiving device (e.g., 107) preferably return to their default compression databases (e.g., the data entries 402-405 in FIG. 4) and implement the above procedure to adapt their compression databases throughout the new communication.

Although the above discussion focused primarily on compressed packet transmissions between a wireless device 107 and a wireline device 108, the present invention is readily implemented in a wireless only system. In this case, the receiving device is a wireless device 109, and communication between the receiving wireless device 109 and the transmitting device 107 occurs via the base site 101 (if the receiving wireless device 109 is served by the same base site 101 as the transmitting device 107) or via the base site 101, the BSC/MSC 103, the packet data router 105, and the particular base site serving the receiving wireless device 109.

As described above, the present invention provides a technique for performing adaptive compression and expansion of packet data that not only provides increased throughput, but also allows the packet data transmission to continue, uninterrupted, while both the transmitting device and the receiving device update their compression databases. In addition, the present invention permits adaptive compression to be utilized in communication systems having one or more slow speed links, such as RF channels, by eliminating the need to retransmit unreceived packets. Unlike prior art adaptive compression approaches, the present invention does not require the receiving device to use every received packet to update its compression database, but rather requires the receiving device to use only received packets that have been selected by the transmitting device to perform the update. By not requiring each transmitted packet to be received, the present invention obviates the need for retransmission of unreceived packets as is typical with existing adaptive compression transmissions over high speed connectioned wireline links. Furthermore, the present invention permits adaptive compression to be used over connectionless wireline networks, such as the Internet, that do not guarantee sequential packet transmission from the packet data router to the receiving device. Unlike existing adaptive compression techniques, the present invention does not require that each transmitted packet be received in sequence to permit use of adaptive compression.

FIG. 5 illustrates a block diagram depiction of a communication device 500 that transmits adaptively compressed data packets in accordance with a preferred embodiment of the present invention. The communication device 500 comprises a data packet generator 501, a selector 503, a compressor 505, a transmitter 507, a buffer memory 509, a compression database 511, a receiver 513, and an antenna 515. The data packet generator 501 and the selector 503 are preferably implemented in a software routine running on a microprocessor or digital signal processor (DSP). The buffer memory 509 and the compression database 511 preferably comprise random access memories (RAMs). The transmitter 507 and the receiver 513 are well-known and preferably support a TDM communication platform for transmitting and receiving data packets. The antenna 515 is also well-known and may comprise an omni-directional or directional antenna. As shown, the preferred transmitting communication device 500 comprises a wireless device; however, in an alternate embodiment, the device 500 might comprise a wireline device, such as a computer terminal, a laptop computer, or a custom data terminal, in a connectionless datagram network.

Operation of the transmitting communication device 500 occurs substantially as follows in accordance with a preferred embodiment of the present invention. The data packet generator 501 generates a plurality of data packets 517 and provides the data packets 517 to the selector 503. The selector 503 selects one or more, but not all, of the data packets 517 and provides the selected packets to the buffer memory 509. The buffer memory 509 stores the selected packets for later use in updating the compression database 511. The selector 503 identifies the packets as being selected by setting their selection flags to a logical 1 or some other particular value. In addition, the selector 503 sets the error correction flags of the selected data packets and the unselected data packets preceding the selected data packets to a first value (e.g., logical 1) to indicate a particular grouping of selected data packets. The selector 503 also sets the error correction flags of the unselected data packets succeeding the selected data packets to a second value (e.g., logical 0) to distinguish the particular group of selected packets from subsequent unselected packets, thereby allowing the communication device receiving the packet data transmission to determine when a complete set of selected packets have been lost during transmission.

The selector 503 provides the selected and unselected data packets forming a first group 519 to the compressor 505. The compressor 505 compares portions (e.g., bit strings) of each selected and unselected data packet in the first group 519 to data entries in the compression database 511. When matches between data entries and portions of data packets occur, the compressor 505 substitutes corresponding compressed data strings provided in the compression database 511 for the matching packet portions to produce compressed data packets 521. The compressor 505 then provides the compressed first group of packets to the transmitter 507. The transmitter 507 formats the packets for transmission in the particular communication system platform and transmits the formatted first group of packets 523 in sequence to a target receiving communication device (not shown) via the antenna 515. While awaiting a response packet 525, the transmitting communication device 500 continues generating data packets 517, compressing the data packets with the current compression database 511, and transmitting the compressed data packets to the target communication device. However, the transmitting communication device 500, in a preferred embodiment, does not select any additional data packets in the selector 503 until the response packet 525 is received.

Upon receiving the response packet 525 from the target communication device at the antenna 515, the receiver 513 deformats the response packet 525 and examines the response packet to determine which, if any, of the selected data packets in the buffer memory 509 were received by the target communication device. When the response packet 525 indicates that at least one selected packet was received by the target device, the receiver 513 sends a control signal 527 to the compression database 511 that identifies which of the selected packets in the buffer memory 509 are to be used to update the compression database 511. The compression database 511 then retrieves the identified selected data packets from the memory buffer 509 and creates additional data entries for the identified selected data packets to adaptively update the compression database 511. Once the database 511 is updated, the database 511 instructs the selector 503 to begin its selection process again. In addition, the database 511 instructs the compressor 505 to begin using the updated database 511 to compress subsequent data packets provided by the selector 503.

When the response packet 525 indicates that none of the selected packets were received by the target device, the receiver 513 sends a control signal 527 to the compression database 511 that indicates none of the selected packets in the buffer memory 509 are to be used to update the compression database 511. The database 511 then instructs the selector 503 to begin its selection process and instructs the compressor 505 to continue using the current database 511 to compress subsequent data packets provided by the selector 503 until receipt of the next response packet 525. The transmitting device 500 continues updating its compression database 511 in response to received response packets for the duration of the data communication (i.e., until the data packet generator 501 ceases producing data packets for a particular communication).

Figure 6:
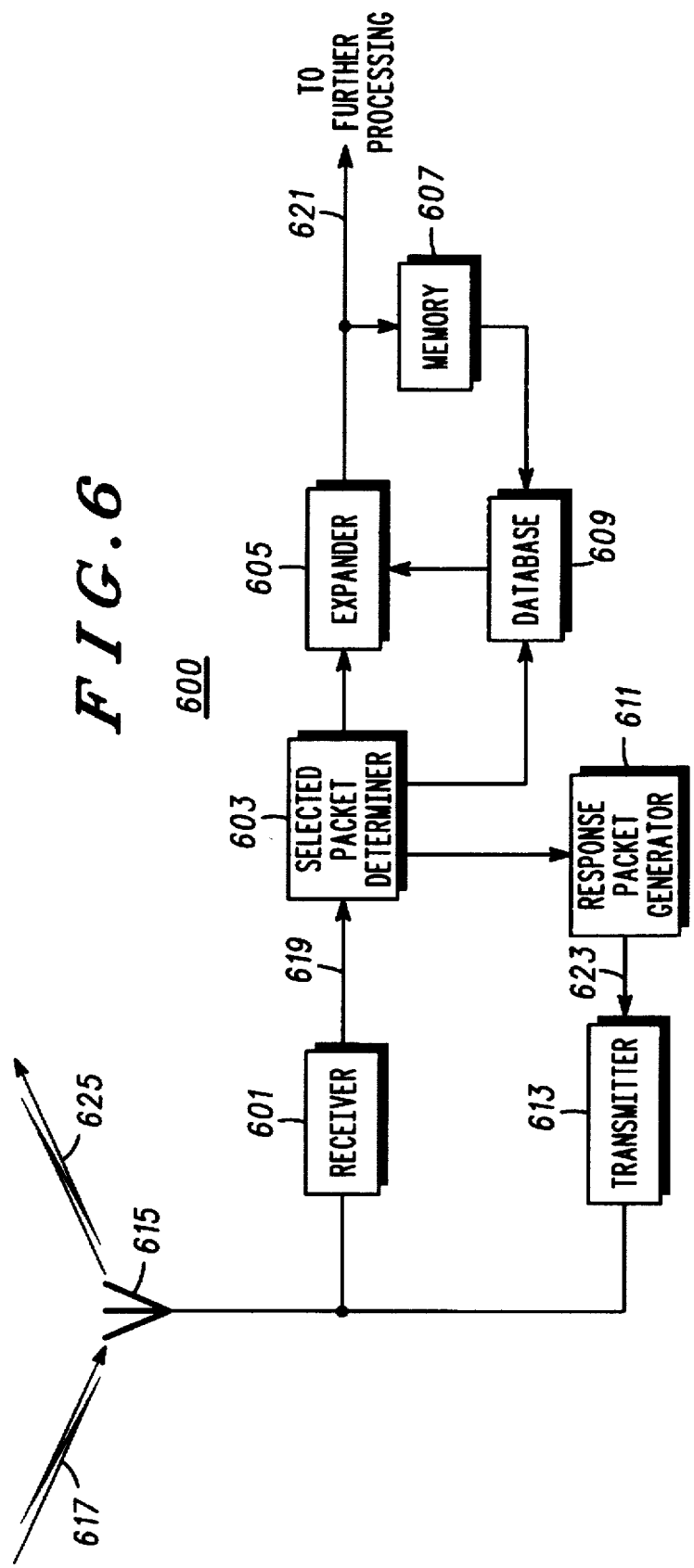
FIG. 6 illustrates a block diagram depiction of a communication device that receives adaptively compressed data packets in accordance with a preferred embodiment of the present invention.

FIG. 6 illustrates a block diagram depiction of a communication device 600 that receives adaptively compressed data packets in accordance with a preferred embodiment of the present invention. The communication device 600 comprises a receiver 601, a selected packet determiner 603, an expander 605, a buffer memory 607, an expansion database 609, a response packet generator 611, a transmitter 613, and an antenna 615. The selected packet determiner 603, the expander 605, and the response packet generator 611 are preferably implemented in a software routine running on a microprocessor or digital signal processor (DSP). The buffer memory 607 and the expansion database 609 preferably comprise random access memories (RAMs). The transmitter 613 and the receiver 601 are well-known and preferably support a TDM communication platform for transmitting and receiving data packets. The antenna 615 is also well-known and may comprise an omni-directional or directional antenna. As shown, the preferred receiving communication device 600 comprises a wireless device; however, in an alternate embodiment, the device 600 might comprise a wireline device, such as a computer terminal, a laptop computer, or a custom data terminal, in a connectionless datagram network.

Operation of the receiving communication device 600 occurs substantially as follows in accordance with a preferred embodiment of the present invention. The receiver 601 receives, via the antenna 615, a plurality of modulated compressed data packets 617 from a sending communication device (not shown), demodulates the received packets and provides the compressed packets 619 to the selected packet determiner 603. The selected packet determiner 603 determines whether the received compressed data packets 619 include any packets that were selected by the sending device prior to transmission. In the preferred embodiment, the selected packet determiner 603 examines the value of the selection flag in each received packet 619 to determine whether the particular packet has been selected. If the selection flag is a logical 1, the selected packet determiner 603 determines that the particular packet has been selected. In the preferred embodiment, the selected packets are selected by the sending device in sequence and each selected packet includes a common value for its error correction flag. Thus, when the selected packet determiner 603 observes a change in the value of a received packet's error correction flag, the selected packet determiner 603 determines that the packets selected by the sending device were received.

Upon encountering a change in error correction flag values, the selected packet determiner 603 informs the response packet generator 611 of which received compressed data packets 619 were selected. In the preferred embodiment, the selected packet determiner 603 provides the sequence numbers of the received selected packets to the response packet generator 611. The response packet generator 611 produces a response packet 623 indicating which selected data packets were received. In the preferred embodiment, the response packet 623 includes a starting sequence number and a bitmap. The starting sequence number is the lowest sequence number of the selected packets received prior to a change in error correction flag value of the received packets and the bitmap denotes which selected packets subsequent to the packet having the starting sequence number were received. When no selected packets are received before a change in error correction flag value, the response packet simply comprises a null, or zero, packet. The response packet generator 611 provides the response packet 623 to the transmitter 613. The transmitter 613 modulates the response packet and transmits the modulated response packet 625 to the sending device via the antenna 615.

After the selected packet determiner 603 evaluates each compressed packet 619 for selection, the selected packet determiner 603 provides each packet serially to the expander 605. The expander 605 expands each compressed packet 619 by comparing portions (e.g., bit strings) of each compressed packet 619 to data entries in the expansion database 609. When matches between data entries and portions of the compressed data packets 619 occur, the expander 605 substitutes corresponding expanded data strings provided in the expansion database 609 for the matching packet portions to produce the original data packets 621. The original packets 621 are provided to another area of the receiving communication device 600 for further processing—e.g., by the Internet Protocol layer or the application software with which the receiving device 600 intends to use the received packet data. In addition, the original packets 621 identified as being selected by the selected packet determiner 603 are provided to, and stored in, the buffer memory 607 for use in updating the expansion database 609.

The expander 605 continues expanding received unselected data packets using the current expansion database 609 until the selected packet determiner 603 detects another selected packet, preferably having a sequence number larger than a sequence number of the last unselected data packet. When the selected packet determiner 603 detects another selected packet, the selected packet determiner 603 instructs the expansion database 609 to retrieve the selected data packets from the memory buffer 607 and create additional data entries for the selected data packets to adaptively update the expansion database 609. Once the database 609 is updated, the database 609 instructs the expander 605 to begin using the updated database 609 to expand subsequent data packets provided by the selected packet determiner 603. Thus, the receipt of additional selected packets informs the receiving device 600 that the sending device received the previously transmitted response packet 623. The receiving device 600 continues updating its expansion database 609 in response to received groups of selected packets for the duration of the data communication (i.e., until the sending device ceases transmitting data packets 617 for a particular communication).

Figure 7:
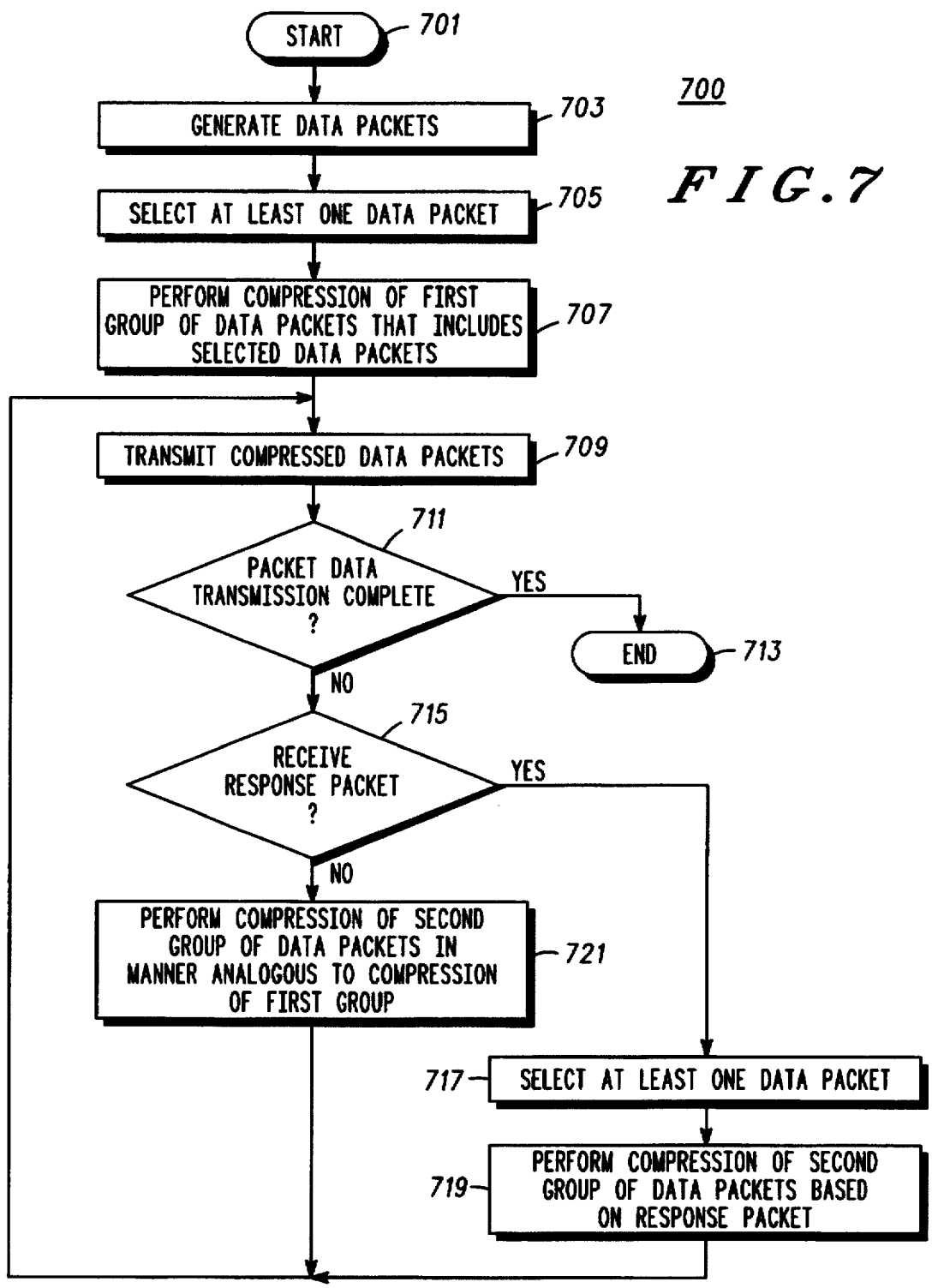
FIG. 7 illustrates a logic flow diagram of steps executed by a communication device to transmit adaptively compressed data packets in accordance with a preferred embodiment of the present invention.

FIG. 7 illustrates a logic flow diagram 700 of steps executed by a communication device to transmit adaptively compressed data packets in accordance with a preferred embodiment of the present invention. The logic flow begins (701) when the transmitting communication device generates (703) data packets to be transmitted. The transmitting device then selects (705) one or more of the data packets, preferably in sequence, by setting the selection flags of the selected packets. The selected packets are preferably stored for later use in updating the compression database. The transmitting device performs (707) a compression of each data packet in a first group of the data packets, wherein the first group includes the selected data packets. As described above, the compression preferably comprises replacing particular bit strings of the data packets with shorter bit strings contained in the compression database. Upon compressing the data packets (selected and unselected) in the first group, the transmitting device transmits (709) the compressed data packets to a target communication device.

Upon transmitting the compressed data packets, the transmitting device determines (711) whether the packet data transmission has been completed. If the packet data transmission has been completed, the logic flow ends (713). However, if the packet data transmission has not been completed, the transmitting device determines (715) whether it has received a response packet from the receiving device. The response packet sets forth which, if any, selected packets were received by the receiving device. If the transmitting device has not received a response packet, the device performs (721) compressions of data packets in at least a second group in a manner analogous to the compression of the first group (i.e., by using the current compression database). The transmitting device then transmits (709) the compressed data packets and the logic flow continues at decision block 711.

If the transmitting device has received the response packet, the transmitting device selects (717) a supplemental set of data packets to indicate receipt of the response packet and the beginning of a new adaptive compression routine. The transmitting device then performs (719) a compression on a second group of data packets, including the supplemental selected data packets, based on the response packet. In a preferred embodiment, the transmitting device updates its compression database based on the response packet by incorporating the stored selected data packets identified as being received by the receiving device in the response packet into additional data entries in the database. The transmitting device then performs the compression of the second group of data packets using the database with the additional data entries (i.e., the updated database), thereby adaptively compressing the data packets based on the response packet. If the response packet indicates that no selected data packets were received by the receiving communication device, the transmitting device performs the compression of the second group of data packets (including the supplemental selected data packets) using the current compression database. Upon compressing the second group of data packets, the transmitting device transmits (709) the compressed data packets and the logic flow continues at decision block 711. The adaptive compression of data packets continues until the particular data communication ends (i.e., until the packet data transmission is completed) as long as response packets are received.

FIG. 8 illustrates a logic flow diagram 800 of steps executed by a communication device to receive adaptively compressed data packets in accordance with a preferred embodiment of the present invention. The logic flow begins (801) when the receiving device receives (803) presently compressed data packets from a first, or transmitting, communication device. The receiving device then performs (805) an expansion of the presently compressed data packets based on a current expansion database and determines (807) whether the presently compressed data packets include one or more selected data packets. The expansion is preferably performed by comparing bit string portions of the compressed data packets to data entries in the current expansion database and, when bit string portions match data entries, substituting expanded representations in the data entries for the respective bit string portions to reproduce the data packets originally generated in the transmitting device.

The determination (807) of selected data packets is preferably accomplished by detecting whether selection flags in the compressed data packets are set. When the selection flag is set, the associated data packet is considered selected. In the preferred embodiment, the selected data packets are selected contiguously by the transmitting device. To designate the end of the selected data packets, the transmitting device assigns a first value to error correction flags of the selected data packets and the unselected data packets having lower sequence numbers than the first selected data packet, and assigns a second value to error correction flags of the unselected data packets having higher sequence numbers than the last selected data packet. Thus, by monitoring the error correction flags of each received data packet, the receiving device can determine when no more selected data packets are forthcoming.

When the receiving device determines (807) that the presently compressed data packets include at least one selected data packet, the receiving device stores (811) the selected data packets in expanded form and transmits (813) a response packet to the transmitting device indicating which selected packets were received. In the preferred embodiment, the response packet includes a starting sequence number and a bitmap indicating which selected data packets having sequence numbers higher than the starting sequence number were received. For example, if selected data packets having sequence numbers 3, 5, and 6 were received and the unselected data packet having sequence number 7 has an error correction flag value different than that of the received selected data packets, the response packet might comprise "3 1011", where "3" is the starting sequence number and "1011" is the bitmap. The starting sequence number indicates the sequence number of the first received selected data packet and the bitmap indicates the selected packets received in sequence, starting with the packet corresponding to the starting sequence number (i.e., "1" corresponds to the packet having sequence number three, "0" corresponds to the packet having sequence number four, "1" corresponds to the packet having sequence number five, and "1" corresponds to the packet having sequence number six). Thus, in this case, the bitmap indicates that the selected packets having sequence numbers three, five, and six were received; whereas, the selected packet having sequence number four was not received.

When the receiving device determines (807) that it has not received any selected data packets, but that selected data packets were transmitted (e.g., as indicated by a change in values of the error correction flags of unselected data packets), the receiving device transmits (813) a null response packet indicating that no selected packets were received. The null response packet preferably includes all zeros.

Upon transmitting the response packet, the receiving device receives (815) additionally compressed data packets. Based on these additionally compressed data packets, the receiving device determines (817) whether the first, or transmitting, communication device received the response packet. This determination preferably comprises identifying whether the additionally compressed data packets include an indication that at least one data packet of the additionally compressed data packets was selected prior to transmission by the transmitting device. The indication might comprise the presence of at least one selected data packet in the additionally compressed data packets or, if no selected data packets are present, a change in error correction flag values in the additionally compressed data packets. That is, in the preferred embodiment, the transmitting device only selects additional data packets after receiving a response packet. Thus, by examining the received additionally compressed data packets for evidence of selection, the receiving device can determine whether the transmitting communication device received the response packet.

When the receiving device determines (817) that the transmitting device received the response packet, the receiving device updates (819) the expansion database using the selected packets stored (811) in memory. In the preferred embodiment, the expansion database creates new entries (i.e., expanded representations and associated compressed representations) for the stored selected data packets. Upon updating the database, the receiving device performs (821) an expansion of the additionally compressed data packets based on the updated expansion database. That is, the receiving device performs an expansion as in block 805; however, in this case, the receiving device uses the expansion database with the new data entries. Thus, when the receiving device uses the updated database to perform the expansion, the receiving device is adaptively expanding the received compressed data packets to recover the data packets that were adaptively compressed by the transmitting device in response to receipt of the response packet.

When the receiving device determines (817) that the transmitting device did not receive the response packet, the receiving device maintains the expansion database and performs (823) an expansion of the additionally compressed data packets based on the current expansion database. That is, the receiving device performs an expansion as in block 805. Upon performing the expansion based on either the updated or current expansion database, the receiving device determines (825) whether the packet data transmission has been completed. When the packet data transmission has been completed (e.g., as denoted by an end of transmission designation in the final data packet), the logic flow ends (809). However, if the packet data transmission has not been completed, the logic flow continues at decision block 807, where the receiving device examines the received compressed data packets to determine whether any of the data packets were selected prior to transmission by the transmitting device.

The present invention encompasses a method and apparatus for adaptively companding (compressing and expanding) data packets in a data communication system. With this invention, adaptive compression and expansion can be utilized in low speed, low reliability link environments, such as RF environments, without requiring retransmission of data packets in the event a data packet is lost during transmission. In addition, the present invention allows adaptive compression to be used in connectionless datagram networks, such as Internet, where packet sequence order is not guaranteed to be maintained. By basing compression/expansion database updates on only a sample of each group of transmitted data packets, the present invention permits adaptive compression to be incorporated in both two-way RF data communication systems and wireline connectionless datagram networks to increase data throughput, without increasing average transmission delay due to requiring each data packet to be received in sequence, as in prior art adaptive compression systems. The increase in average transmission delay in prior art techniques due to the requirement of retransmission can be fatal in slower speed link environments due to the propensity for upper level protocol layers, such as the transmission control protocol (TCP), to time out before receipt of the retransmission.

While the present invention has been particularly shown and described with reference to particular embodiments thereof, it will be understood by those skilled in the art that various changes in form and details may be made therein without departing from the spirit and scope of the present invention.

I claim:

1. A method for adaptively compressing data packets for transmission between a first communication device and a second communication device, the method comprising the steps of:

a) generating, by the first communication device, a plurality of data packets;

b) selecting, by the first communication device, at least one of the plurality of data packets to produce at least one selected data packet, wherein a quantity of the at least one selected data packet is less than the plurality of data packets;

c) performing, by the first communication device, a first compression of each data packet in a first group of the plurality of data packets that includes the at least one selected data packet to produce compressed data packets;

d) transmitting, by the first communication device, the compressed data packets to the second communication device;

e) receiving, by the second communication device, the compressed data packets to produce received compressed data packets;

f) determining, by the second communication device, whether the received compressed data packets include the at least one selected data packet;

g) when the received compressed data packets include the at least one selected data packet, transmitting, by the second communication device, a response packet to the first communication device, the response packet indicating which selected data packets of the at least one selected data packet were received by the second communication device; and h) upon receipt of the response packet, performing, by the first communication device, a second compression of each data packet in a second group of the plurality of data packets based on the response packet to produce adaptively compressed data packets.

2. The method of claim 1, wherein each of the plurality of data packets includes a selection flag, and wherein step (b) further comprises the step of setting the selection flag of each selected data packet to indicate that a particular data packet has been selected.

3. The method of claim 2, wherein step (f) comprises the step of determining whether the selection flag of at least one of the received compressed data packets is set.

4. The method of claim 1, wherein step (b) comprises the steps of:

b1) assigning each of the plurality of data packets a corresponding sequence number; and b2) selecting, in sequence, at least two of the plurality of data packets to produce the at least one selected data packet.

5. The method of claim 4, wherein each of the plurality of data packets further includes an error correction flag, and wherein step (b) further comprises the steps of:

b3) assigning the error correction flag of the at least one selected data packet and each unselected data packet having a sequence number less than the corresponding sequence number of a first selected data packet of the at least one selected data packet to a first value to indicate a respective grouping of data packets; and b4) assigning the error correction flag of each unselected data packet having a sequence number larger than the corresponding sequence number of a last selected data packet of the at least one selected data packet to a second value to distinguish the respective grouping from subsequent unselected packets;

the method further comprising the steps of:

i) determining, by the second communication device, whether a value of the error correction flag of each received compressed data packet is identical to an expected value of the error correction flag; and j) when the received compressed data packets do not include the at least one selected data packet and the value of the error correction flag of a received compressed data packet is not identical to the expected value of the error correction flag, transmitting, by the second communication device, a second response packet to the first communication device, wherein the second response packet indicates that the at least one selected data packet was not received.

6. The method of claim 4, wherein step (g) further comprises the step of, when the received compressed data packets include a selected data packet having a sequence number lower than an expected sequence number, excluding any reference to the selected data packet having the sequence number lower than the expected sequence number in the response packet.

7. The method of claim 1, wherein step (c) comprises the steps of:

c1) comparing a first string of data in each data packet of the first group to a database of data entries; and c2) when at least a portion of the first string of data is identical to a data entry in the database, replacing the at least a portion of the first string of data with a code associated with the data entry, the code comprising less bits than the at least a portion of the first string of data.

8. The method of claim 7, wherein step (h) comprises the steps h1) upon receipt of the response packet, creating at least one additional data entry in the database based on which selected data packets were received by the second communication device;

h2) comparing a second string of data in each data packet of the second group to the database of data entries including the at least one additional data entry; and h3) when at least a portion of the second string of data is identical to a data entry in the database, replacing the at least a portion of the second string of data with a code associated with the data entry, said code comprising less bits than the at least a portion of the second string of data.

9. The method of claim 1, further comprising the step of:

i) when the received compressed data packets do not include the at least one selected data packet, transmitting, by the second communication device, a second response packet to the first communication device, wherein the second response packet indicates that the at least one selected data packet was not received.

10. The method of claim 1, wherein step (h) comprises the steps of:

h1) upon receipt of the response packet, selecting, by the first communication device, at least one data packet of the second group of the plurality of data packets to produce at least one supplemental selected data packet; and h2) performing the second compression of each data packet in the second group based on the response packet to produce the adaptively compressed data packets, wherein the second group includes the at least one supplemental selected data packet.

11. The method of claim 10, further comprising the steps of:

i) transmitting, by the first communication device, the adaptively compressed data packets to the second communication device;

j) receiving, by the second communication device, the adaptively compressed data packets to produce received adaptively compressed data packets;

k) determining, by the second communication device, whether the received adaptively compressed data packets include the at least one supplemental selected data packet;

l) when the received adaptively compressed data packets include the at least one supplemental selected data packet, transmitting, by the second communication device, a second response packet to the first communication device, the second response packet indicating which selected data packets of the at least one supplemental selected data packet were received by the second communication device; and m) upon receipt of the second response packet, performing, by the first communication device, a third compression of each data packet in a third group of the plurality of data packets based on the second response packet to produce supplemental adaptively compressed data packets.

12. The method of claim 11, further comprising the step of:

n) repeating steps (h) through (m) until the plurality of data packets are transmitted.

13. A method for a first communication device to adaptively compress data packets for transmission to a second communication device, the method comprising the steps of:

a) generating a plurality of data packets;

b) selecting at least one of the plurality of data packets to produce at least one selected data packet, wherein a quantity of the at least one selected data packet is less than the plurality of data packets;

c) performing a first compression of each data packet in a first group of the plurality of data packets that includes the at least one selected data packet to produce compressed data packets;

d) transmitting the compressed data packets to the second communication device;

e) receiving a response packet from the second communication device, the response packet indicating which selected data packets of the at least one selected data packet were received by the second communication device; and f) performing a second compression of each data packet in a second group of the plurality of data packets based on the response packet to produce adaptively compressed data packets.

14. The method of claim 13, wherein each of the plurality of data packets includes a selection flag, and wherein step (b) further comprises the step of setting the selection flag of each selected data packet to indicate that a particular data packet has been selected.

15. The method of claim 13, wherein step (b) comprises the steps of:

b1) assigning each of the plurality of data packets a corresponding sequence number; and b2) selecting, in sequence, at least two of the plurality of data packets to produce the at least one selected data packet.

16. The method of claim 15, wherein each of the plurality of data packets further includes an error correction flag, and wherein step (b) further comprises the steps of:

b3) assigning the error correction flag of the at least one selected data packet and each unselected data packet having a sequence number less than the corresponding sequence number of a first selected data packet of the at least one selected data packet to a first value to indicate a respective grouping of data packets; and b4) assigning the error correction flag of each unselected data packet having a sequence number larger than the corresponding sequence number of a last selected data packet of the at least one selected data packet to a second value to distinguish the respective grouping from subsequent unselected packets.

17. The method of claim 13, wherein step (c) comprises the steps of:

c1) comparing a first string of data in each data packet of the first group to a database of data entries; and c2) when at least a portion of the first string of data is identical to a data entry in the database, replacing the at least a portion of the first suing of data with a code associated with the data entry, the code comprising less bits than the at least a portion of the first string of data.

18. The method of claim 17, wherein step (f) comprises the steps of:

f1) creating at least one additional data entry in the database based on which selected data packets were received by the second communication device;

f2) comparing a second string of data in each data packet of the second group to the database of data entries including the at least one additional data entry; and f3) when at least a portion of the second string of data is identical to a data entry in the database, replacing the at least a portion of the second string of data with a code associated with the data entry, said code comprising less bits than the at least a portion of the second string of data.

19. A method for a first communication device to adaptively decompress data packets received from a second communication device, the method comprising the steps of:

a) receiving a plurality of compressed data packets from the second communication device to produce received compressed data packets;

b) determining whether the received compressed data packets include at least one data packet selected by the second communication device to produce at least one selected data packet;

c) when the received compressed data packets include the at least one selected data packet, storing the at least one selected data packet to produce at least one stored selected data packet and transmitting a response packet to the second communication device, the response packet indicating which selected data packets of the at least one selected data packet were received;

d) receiving a plurality of adaptively compressed data packets from the second communication device to produce received adaptively compressed data packets, the plurality of adaptively compressed data packets being compressed based on the response packet; and e) performing an expansion of the received adaptively compressed data packets based on the at least one stored selected data packet.

20. The method of claim 19, wherein each of the plurality of compressed data packets includes a selection flag and wherein step (b) comprises the step of determining whether the selection flag of at least one of the received compressed data packets is set.

21. The method of claim 19, wherein each of the plurality of compressed data packets further includes a sequence number and an error correction flag, the error correction flag of the at least one selected data packet being assigned a first value to indicate a respective grouping of selected data packets, and the error correction flag of each unselected data packet having a sequence number larger than a sequence number of a last selected data packet being assigned a second value to distinguish the respective grouping from subsequent unselected data packets, the method further comprising the steps of:

f) determining whether a value of the error correction flag of each received compressed data packet is identical to an expected value of the error correction flag; and g) when the received compressed data packets do not include the at least one selected data packet and the value of the error correction flag of a received compressed data packet is not identical to the expected value of the error correction flag, transmitting a second response packet to the second communication device, wherein the second response packet indicates that the at least one selected packet was not received.

22. The method of claim 19, wherein each of the plurality of compressed data packets includes a sequence number and wherein step (c) further comprises the step of, when the received compressed data packets include a selected data packet having a sequence number lower than an expected sequence number, excluding any reference in the response packet to the selected data packet having the sequence number lower than the expected sequence number.

23. The method of claim 22, wherein the expected sequence number comprises a sequence number subsequent to a sequence number of a last unselected data packet received prior to receiving the plurality of compressed data packets.

24. The method of claim 22, wherein the expected sequence number comprises a sequence number subsequent to a sequence number of a last data packet received prior to receiving the plurality of compressed data packets.

25. The method of claim 19, wherein the step of transmitting the response packet to the second communication device comprises the step of transmitting a bitmap to the second communication device, the bitmap indicating which selected data packets of the at least one selected data packet were received.

26. A communication device for transmitting adaptively compressed data packets, the communication device comprising:

a data packet generator;

a selector, coupled to the data packet generator, for selecting at least one of a plurality of data packets produced by the data packet generator to produce at least one selected data packet, wherein a quantity of the at least one selected data packet is less than the plurality of data packets;

a memory, coupled to the selector, for storing the at least one selected data packet;

a database, coupled to the memory, containing data entries that associate particular data strings to corresponding compressed code words, each compressed code word containing fewer bits than a corresponding particular data string;

a compressor, coupled to the selector and the database, for comparing portions of a group of the plurality of data packets, that includes the at least one selected data packet, to the data entries in the database and, when particular portions of the group match respective data entries, substituting corresponding compressed code words for those particular portions to produce compressed data packets;

a transmitter, coupled to the compressor, for transmitting the compressed data packets to a target communication device; and a receiver, coupled to the database, for receiving a response packet from the target communication device, instructing the database to retrieve, from the memory, selected data packets of the at least one selected data packet identified in the response packet, and instructing the database to create additional data entries corresponding to the selected data packets, thereby allowing the database to be adaptively updated for subsequent compressed data packet transmissions.

27. A communication device for receiving adaptively compressed data packets, the communication device comprising:

a receiver that receives a plurality of compressed data packets from a sending communication device to produce received compressed data packets, the plurality of compressed data packets including at least one data packet selected by the sending communication device prior to transmission to produce at least one selected data packet, wherein a quantity of the at least one selected data packet is less than the plurality of compressed data packets;

a database containing data entries that associate compressed code words with corresponding expanded data strings, each of the expanded data strings including more bits than a corresponding compressed code word;

a selected packet determiner, coupled to the receiver and the database, that determines which of the received compressed data packets comprise the at least one selected data packet and that instructs the database to create an additional data entry for each selected data packet, thereby adaptively updating the database for use during a subsequent reception of compressed data packets; and an expander, coupled to the receiver and the database, that compares portions of the received compressed data packets to the data entries in the database and, when particular portions of the received compressed data packets match respective data entries, that substitutes corresponding expanded data strings for those particular portions to reproduce original data packets from the received compressed data packets.

28. The communication device of claim 27, further comprising:

a response packet generator, coupled to the selected packet determiner, that produces a response packet indicating which selected data packets of the at least one selected data packet were received by the selected packet determiner; and a transmitter, coupled to the response packet generator, that transmits the response packet to the sending communication device, thereby allowing the sending communication device to adaptively compress data packets prior to transmission based on which selected data packets of the at least one selected data packet were received by the selected packet determiner.

29. The communication device of claim 28, wherein the response packet generator comprises a bitmap generator that creates a bitmap representing which selected data packets of the at least one selected data packet were received by the selected packet determiner.

30. The communication device of claim 27, further comprising:

a memory, coupled to the expander and the database, that stores expanded representations of the received compressed data packets that comprise the at least one selected data packet and, upon request from the database, provides the expanded representations to the database to facilitate creation of additional data entries for the at least one selected data packet.

* * * * *